United States Patent
Xu et al.

(10) Patent No.: US 8,106,469 B2
(45) Date of Patent: Jan. 31, 2012

(54) METHODS AND APPARATUS OF FLUORINE PASSIVATION

(75) Inventors: Jeff J. Xu, Jhubei (TW); Liang-Gi Yao, Shin-Chu (TW); Ta-Ming Kuan, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 206 days.

(21) Appl. No.: 12/687,574

(22) Filed: Jan. 14, 2010

(65) Prior Publication Data
US 2011/0169104 A1    Jul. 14, 2011

(51) Int. Cl.
*H01L 21/02* (2006.01)

(52) U.S. Cl. ............ 257/411; 257/E29.255; 257/E21.19; 438/591

(58) Field of Classification Search ................ 257/411, 257/E21.19, E29.255; 438/591
See application file for complete search history.

(56) References Cited

U.S. PATENT DOCUMENTS

| 5,814,562 | A | 9/1998 | Green et al. |
| 6,368,963 | B1 * | 4/2002 | Foster ........................... 438/655 |
| 6,667,232 | B2 * | 12/2003 | Keating et al. ................. 438/632 |
| 6,783,695 | B1 * | 8/2004 | Torek et al. ................... 252/79.1 |
| 7,667,247 | B2 * | 2/2010 | Wang et al. .................... 257/287 |

OTHER PUBLICATIONS

Jiann Heng Chen et al., "Nitrogen Implantation and In Situ HF Vapor Clean for Deep Submicrometer n-MOSFETs", Journal of the Electrochemical Society, 149 (1) G63-G69 (2002).

* cited by examiner

*Primary Examiner* — Trung Q Dang
(74) *Attorney, Agent, or Firm* — Haynes and Boone, LLP (57) ABSTRACT

The present disclosure provides methods and apparatus of fluorine passivation in IC device fabrication. In one embodiment, a method of fabricating a semiconductor device includes providing a substrate and passivating a surface of the substrate with a mixture of hydrofluoric acid and alcohol to form a fluorine-passivated surface. The method further includes forming a gate dielectric layer over the fluorine-passivated surface, and then forming a metal gate electrode over the gate dielectric layer. A semiconductor device fabricated by such a method is also disclosed.

20 Claims, 7 Drawing Sheets

METHODS AND APPARATUS OF FLUORINE PASSIVATION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. For example, the reliability and functional challenges of ultrathin gate oxides are becoming increasingly greater for increasingly small IC devices. Hence, reduction in interface defect density (Dit) at the substrate/oxide interface to increase carrier mobility and reduce current leakage, and reduction in capacitive effective thickness (Cet) to increase scale, in current IC fabrication processes is highly desirable.

Therefore, while existing methods of fabricating semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

The present disclosure provides for many different embodiments. One of the broader forms of the present disclosure involves a method of fabricating a semiconductor device. The method includes providing a substrate and passivating a surface of the substrate with a mixture of hydrofluoric acid and alcohol to form a fluorine-passivated surface. The method further includes forming a gate dielectric layer over the fluorine-passivated surface, and then forming a metal gate electrode over the gate dielectric layer.

Another of the broader forms of the present disclosure involves a method of fabricating a semiconductor device. The method includes providing a substrate; cleaning a surface of the substrate to remove particulates and contaminants; and passivating the cleaned surface of the substrate with a mixture of hydrofluoric acid vapor and isopropyl alcohol vapor or ammonia vapor ($NH_3$) to form a fluorine-passivated surface including fluorine at an atomic concentration greater than 2%. The method further includes forming an interfacial layer over the fluorine-passivated surface to a thickness less than 1 nanometer; forming a gate dielectric layer over the interfacial layer to a thickness between about 1 nanometer and about 3 nanometers; and forming a metal gate electrode over the gate dielectric layer.

Yet another of the broader forms of the present disclosure involves an apparatus that includes a semiconductor device. The semiconductor device includes a substrate including a fluorine-passivated surface passivated by a mixture of hydrofluoric acid vapor and isopropyl alcohol vapor or ammonia vapor ($NH_3$); and an interfacial layer disposed over the fluorine-passivated surface, the interfacial layer having a thickness less than about 1 nanometer. The device further includes a gate dielectric layer disposed over the interfacial layer, the gate dielectric layer having a higher dielectric constant than the interfacial layer; and a metal gate electrode disposed over the gate dielectric layer.

DETAILED DESCRIPTION

The present disclosure relates generally to the fabrication of a semiconductor device, and more particularly, to methods for passivating a semiconductor substrate with a fluorine mixture and devices fabricated by such methods.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
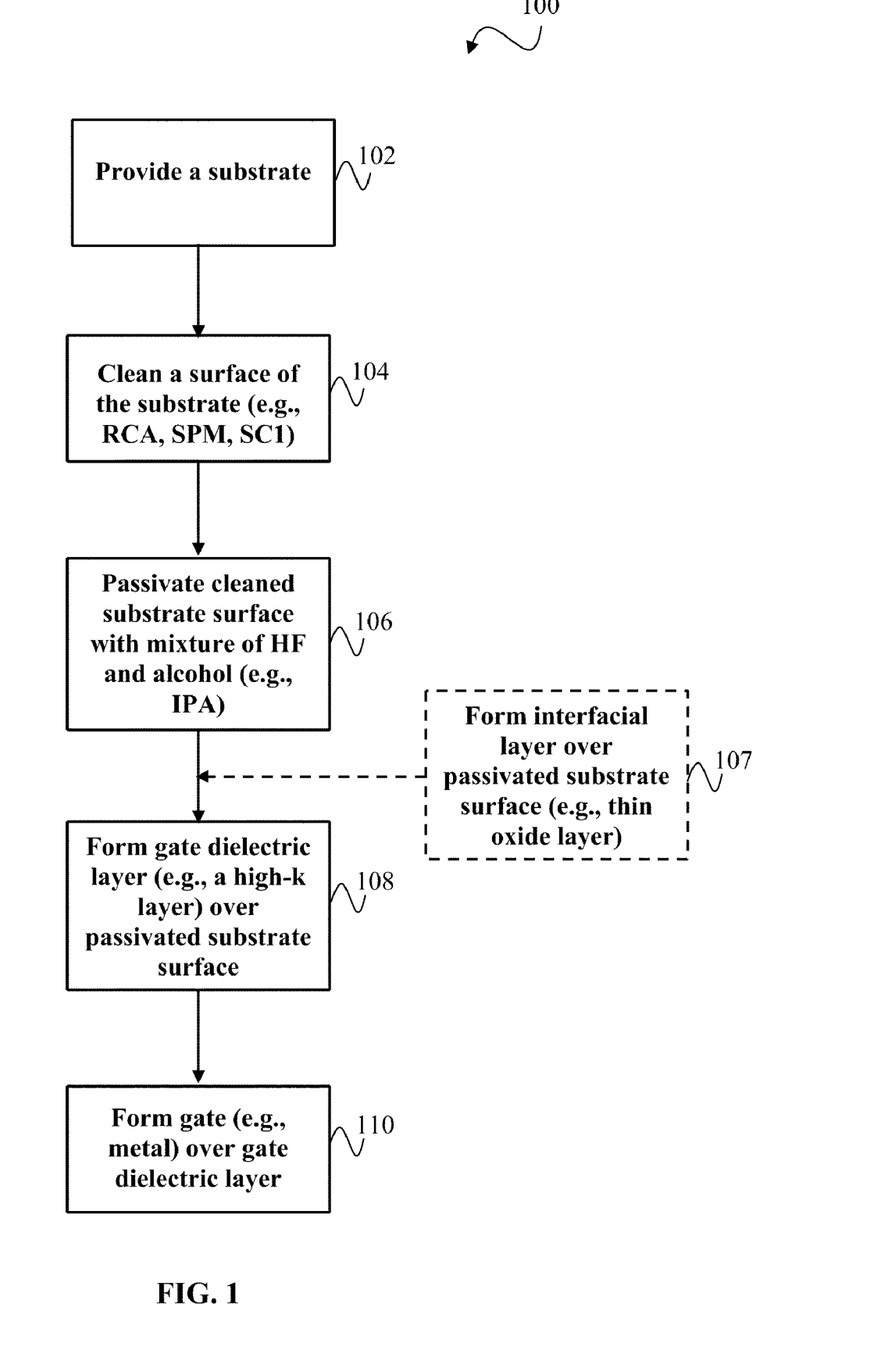
FIG. 1 is a flowchart illustrating a method of fabricating a semiconductor device according to various aspects of the present disclosure.
Figure 2A:
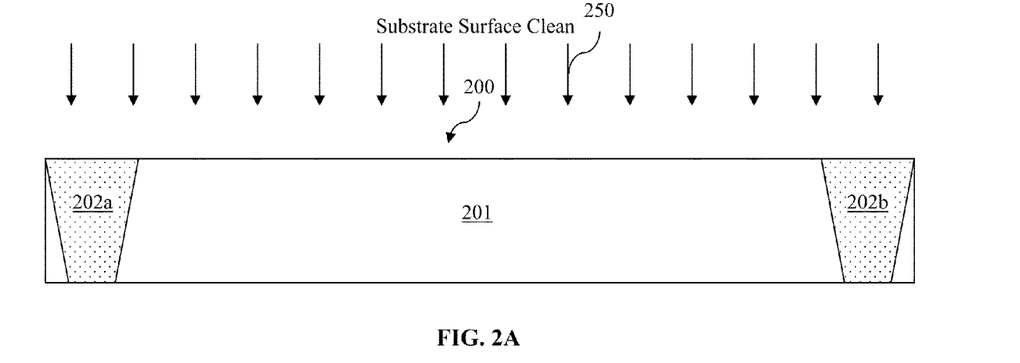
FIGS. 2A to 2J illustrate cross-sectional views of the semiconductor device at various stages of fabrication according to the method of FIG. 1.

Illustrated in FIG. 1 is a flowchart of an example method 100 for fabricating a semiconductor device. FIGS. 2A-2J are diagrammatic fragmentary cross-sectional side views of the semiconductor device during various fabrication stages. Illustrated in FIG. 3 is an example system 300 for fluorine-passivating a substrate of the semiconductor device. The semiconductor device may include an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors. It is understood that FIGS. 2A-2J have been simplified for a better understanding of the inventive concepts of the present disclosure. Accordingly, it should be noted that additional processes may be provided before, during, and after the method 100 of FIG. 1, and that some other processes may only be briefly described herein.

Referring now to FIG. 1, the method 100 begins with block 102 in which a substrate is provided, for example in a spray chamber. The method 100 continues with block 104 in which a surface of the substrate is cleaned to remove particulates and/or contaminants, which may include organic and/or metallic materials. The cleaned surface of the substrate is then passivated by a mixture including fluorine and an alcohol, at block 106, to form a fluorine-passivated surface on the substrate. A gate dielectric layer is formed over the fluorine-passivated surface, as shown in block 108. An interfacial layer, for example a thin oxide, is optionally formed between the fluorine-passivated surface and the gate dielectric layer, as shown in block 107. A metal gate electrode is then formed over the gate dielectric layer, as shown in block 110.

Referring now to FIGS. 2A-2J in conjunction with FIG. 1, a semiconductor device 200 is fabricated in accordance with the method 100 of FIG. 1. The semiconductor device 200 has a substrate 201. The substrate 201 is a silicon substrate doped with a P-type dopant, such as boron (a P-type substrate). Alternatively, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Shallow trench isolation (STI) features 202a, 202b may also be formed in the substrate 201. The STI features 202a, 202b are formed by etching recesses (or trenches) in the substrate 201 and filling the recesses with a dielectric material. In an embodiment, the dielectric material of the STI features 202a, 202b includes silicon oxide. In alternative embodiments, the dielectric material of the STI features 202a, 202b may include silicon nitride, silicon oxy-nitride, fluoride-doped silicate (FSG), and/or a low-k dielectric material known in the art.

Referring to FIG. 2A, a top surface of substrate 201 undergoes a surface clean 250 (as shown by downward arrows) to remove particulates and/or contaminants, which may include organic and/or metallic materials. The cleaning process may include a variety of conventional chemicals and techniques, and in one example may include the use of hydrofluoric acid, ammonium hydroxide, hydrogen peroxide, hydrochloric acid, sulfuric acid, and/or ozone. In one example, the chemicals may be utilized in a wet dip or liquid, vapor and/or heated environment to clean the substrate surface. In yet another example, standard RCA, SPM, SC1, and/or SC2 chemicals and processes may be used to clean the substrate surface.

Figure 2B:
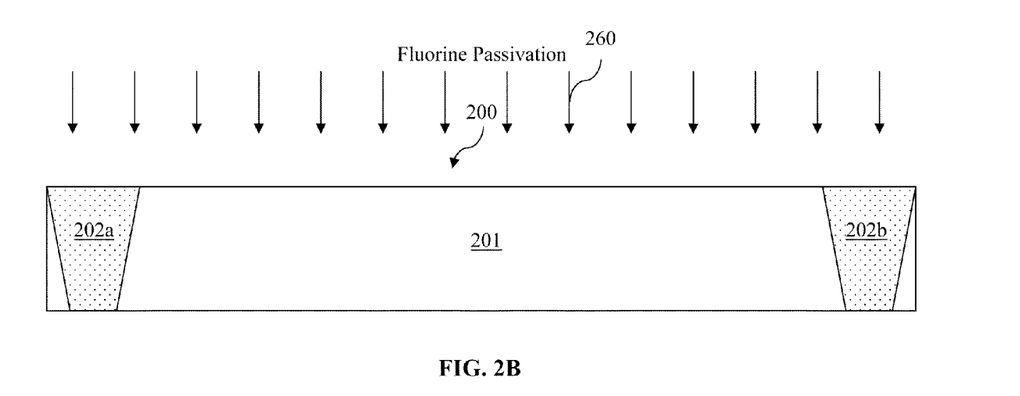
Figure 2C:
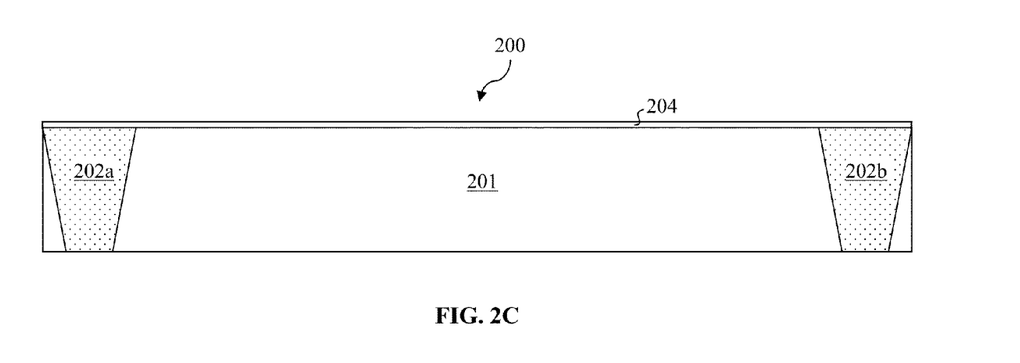
Figure 3:
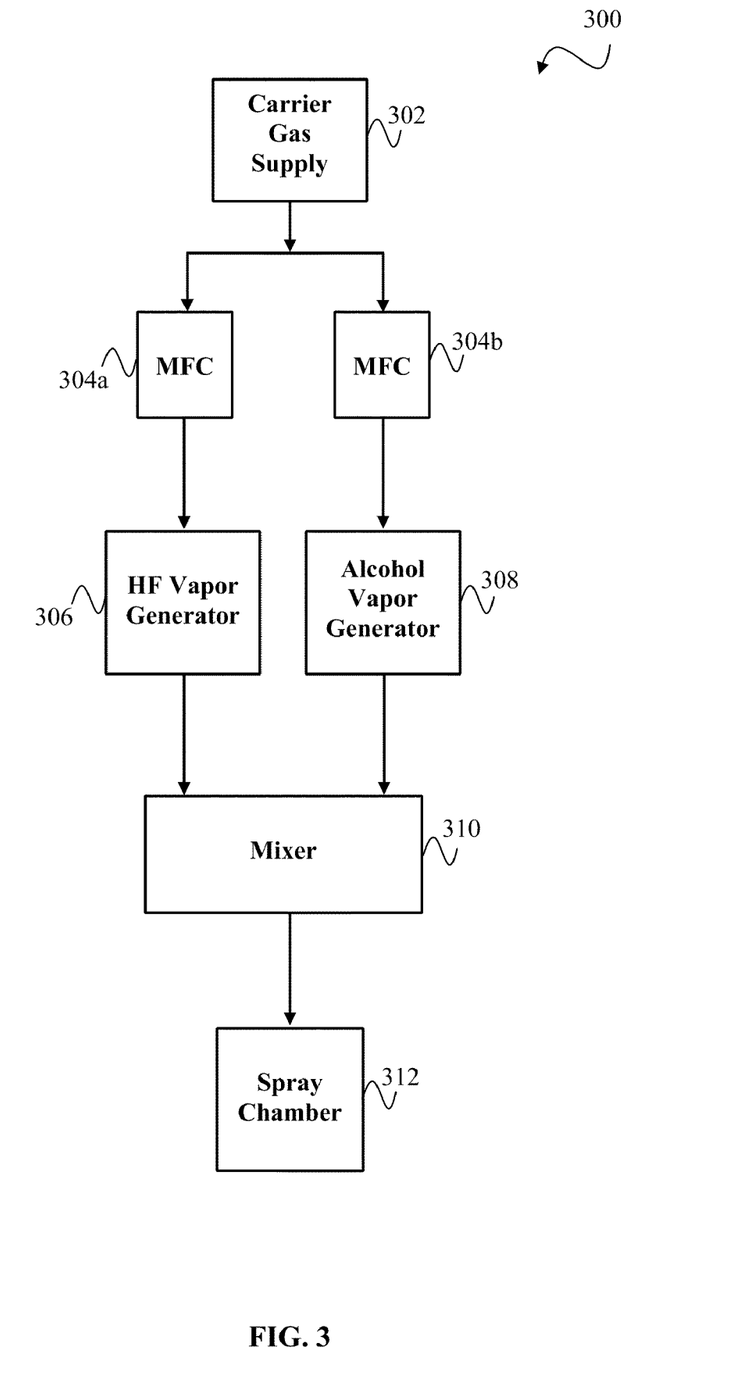
FIG. 3 is a block diagram illustrating a system for fluorine passivating a semiconductor substrate surface according to various aspects of the present disclosure.

Thereafter, as shown in FIG. 2B, the cleaned surface of the substrate 201 undergoes fluorine passivation 260 (as shown by downward arrows) to form a fluorine-passivated surface 204 over the bulk substrate 201 and the STI features 202a, 202b, as shown in FIG. 2C.

In the present embodiment, substrate 201 is passivated by a mixture including fluorine and an alcohol, such as isopropyl alcohol (IPA), methanol, or ammonia. In an example, the mixture may include a hydrous hydrofluoric acid vapor and an IPA vapor supplied by a carrier gas such as nitrogen. In another example, the passivation mixture includes between about 10 wt % and about 80 wt % of hydrous hydrofluoric acid vapor, for example including hydrofluoric acid at about 49 wt %. In another example, the passivation mixture includes hydrofluoric acid vapor and IPA vapor at a weight ratio of around 0.5/1 to 10/1, for example around 3/1. In yet another example, the mixture may include hydrofluoric acid and an alcohol in a different form, such as a liquid or aqueous form of HF and IPA. In yet another example, the mixture may include hydrofluoric acid and ammonia ($NH_3$). Other carrier gases which are essentially non-reactive with silicon, such as argon, may be suitable. In another embodiment, fluorine-passivated surface 204 includes carbon, oxygen, fluorine, and silicon atoms, and the fluorine passivation process is tuned to form the fluorine-passivated surface 204 to include fluorine at an atomic concentration greater than 2% and/or to minimize the atomic concentration of carbon and oxygen residue at the fluorine-passivated surface. The amount of hydrofluoric acid and alcohol provided in the passivation mixture may be used to tune the fluorine passivation process.

Fluorine passivation 260 may occur at between ambient temperature and about 100 degrees Celsius and between atmospheric pressure and about 300 torr in one embodiment, and does not require high temperature implantation, annealing, UV light, or plasma processing, thereby avoiding interface defects that may occur from those processes. In the other embodiment, fluorine passivation 260 may occur at between room temperature and about 100 degrees Celsius and between 1 mtorr and about 10 torr, and then with a baking process from about 50 to about 200 degrees.

Figure 2D:
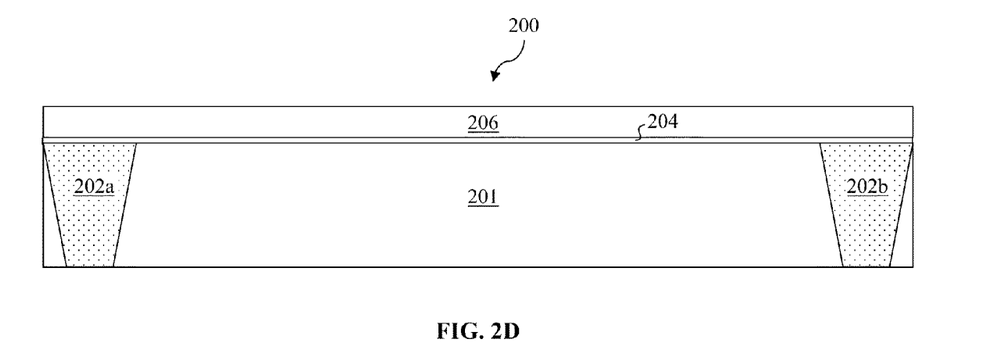

Thereafter, an interfacial layer 206 is optionally formed over the fluorine-passivated surface 204, as shown in FIG. 2D. In one example, the interfacial layer 206 is formed by an atomic layer deposition (ALD) process and includes silicon oxide ($SiO_2$). In another example, the interfacial layer 206 is grown in an oxygen environment below 1000 degrees Celsius, and in another example below 850 degrees Celsius. The interfacial layer 206 has a thickness less than about 1 nm, and in one embodiment, may be in a range from approximately 0.3 nanometers (nm) to approximately 1 nm.

Figure 2E:
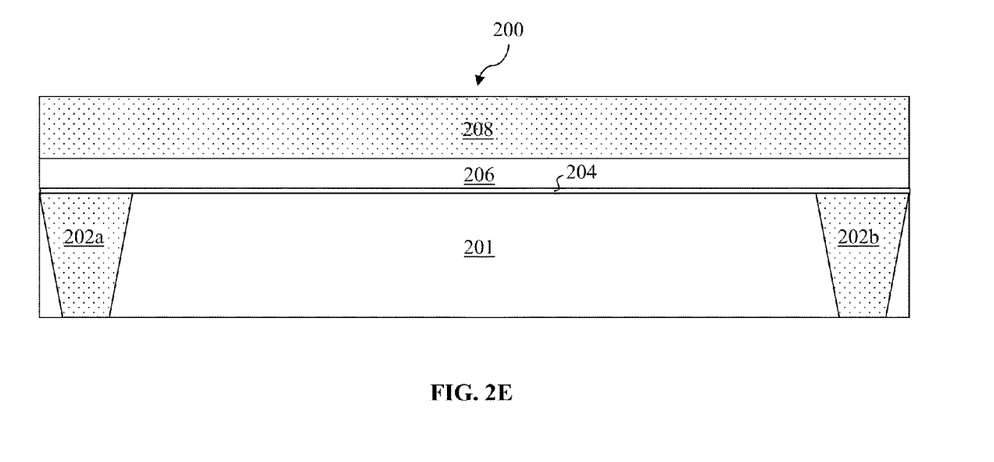

A dielectric layer 208 is then formed over the interfacial layer 206, as shown in FIG. 2E. However, as noted above, interfacial layer 206 is optional and the dielectric layer 208 may be formed over the fluorine-passivated surface 204 without an intervening interfacial layer. In one example, the dielectric layer 208 is formed by an ALD process and includes a high-k dielectric material. A high-k dielectric material is a material having a dielectric constant that is greater than a dielectric constant of $SiO_2$, which is approximately 4. In an embodiment, the dielectric layer 208 includes hafnium oxide ($HfO_2$), which has a dielectric constant that is in a range from approximately 18 to approximately 40. The dielectric layer 208 has a thickness that is greater than the interfacial layer 206, and in one embodiment, may be in a range from about 1 nanometer to about 3 nanometers. In alternative embodiments, the dielectric layer 208 may include one of AlO, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, and so on.

Figure 2F:
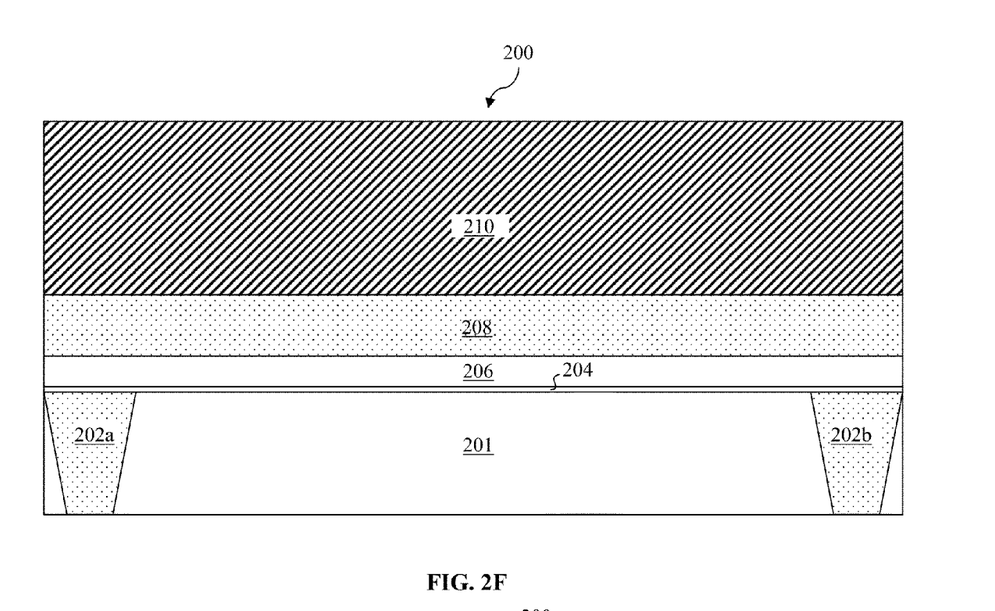

Referring now to FIG. 2F, a gate electrode layer 210 is formed over the gate dielectric layer 208. The gate electrode layer 210 may include a metallic material, such as TiN, TaN, TaC, TaSiN, WN, TiAl, tungsten (W), aluminum (Al), copper (Cu), or combinations thereof in the main body of the poly gate electrode. The metal gate electrode layer 210 may be formed by chemical vapor deposition (CVD), physical vapor deposition (PVD), or another suitable technique. The metal layer is a small portion of the gate electrode layer 210 in a gate first process flow.

Figure 2G:
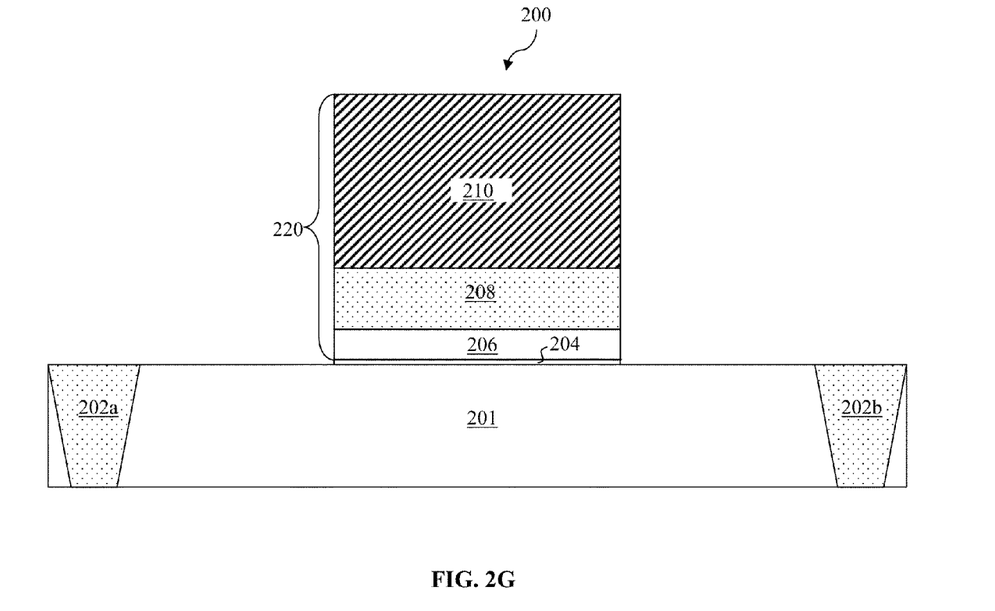

Referring to FIG. 2G, the fluorine-passivated surface 204, the interfacial layer 206, the gate dielectric layer 208, and the gate electrode layer 210 are patterned using a photolithography process known in the art to form a gate structure 220 (also referred to as a gate stack) of the semiconductor device 200. The fluorine-passivated surface 204 is also removed over the STI structures 202a, 202b during this step, with the fluorine-passivated surface advantageously reducing loss of dielectric material from the STI structures during an etching or patterning process. In another embodiment, the gate stack with fluorined-passivated surface is formed in gate-last process flow (replacement gate flow).

Figure 2H:
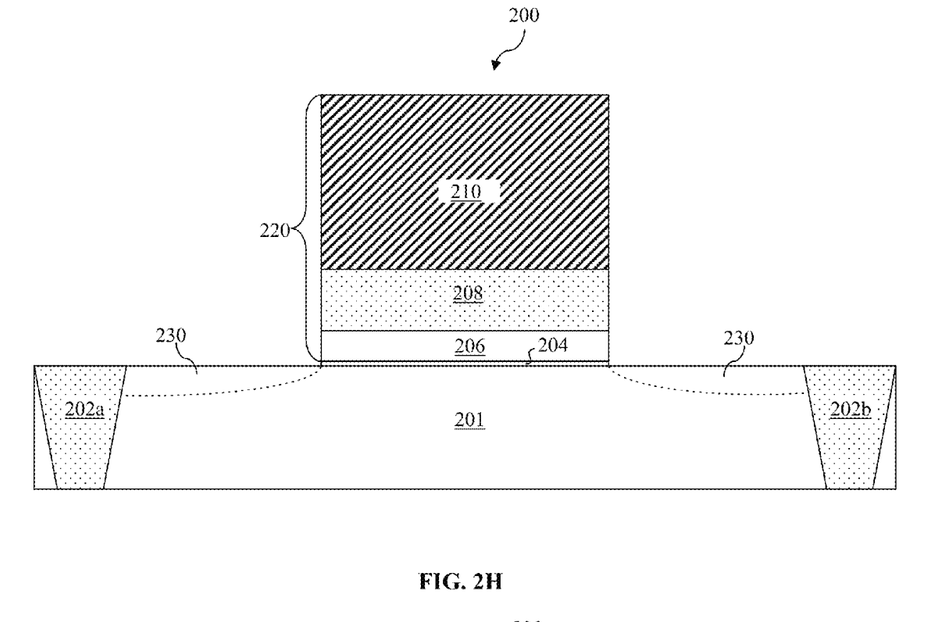

Referring to FIG. 2H, after the gate structure 220 is formed, lightly doped source/drain (also referred to as LDD) regions 230 may be formed in portions of the substrate 201 on either side of the gate structure 220. The LDD regions may be formed by an ion implantation process or a diffusion process known in the art. N-type dopants, such as phosphorus or arsenic, may be used to form the semiconductor device 200 as an NMOS device, and P-type dopants, such as boron, may be used to form the semiconductor device 200 as a PMOS device.

Figure 2I:
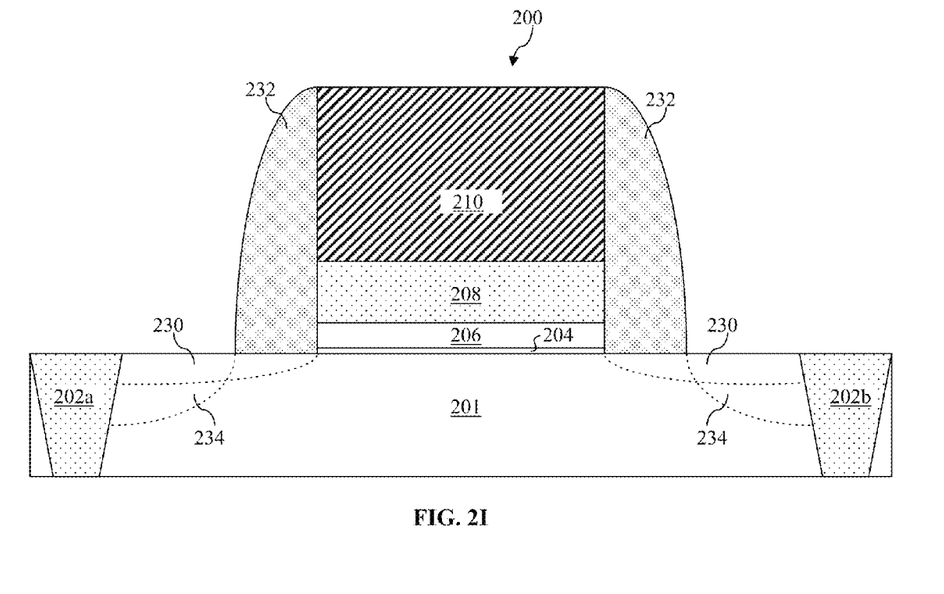

Gate spacers 232 may then be formed over the substrate and on either side of the gate structure 220 using a deposition process and an etching process (for example, an anisotropic etching process) known in the art, as shown in FIG. 2I. The gate spacers 232 include a suitable dielectric material, such as silicon nitride, silicon oxide, silicon carbide, silicon oxynitride, or combinations thereof. Thereafter, heavily doped source and drain regions 234 (also referred to as active regions) are formed in portions of the substrate on either side of the gate spacers 232. The active regions 234 may be formed by an ion implantation process or a diffusion process known in the art. N-type dopants, such as phosphorus or arsenic, may be used to form the semiconductor device 200 as an NMOS device, and P-type dopants, such as boron, may be used to form the semiconductor device 200 as a PMOS device. The active regions 234 are aligned with the gate spacers 232.

Figure 2J:
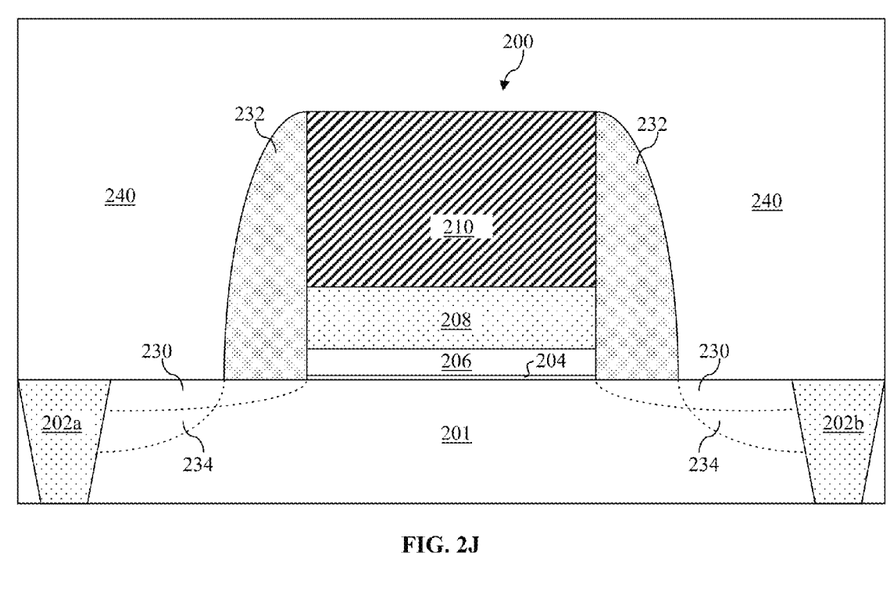

An inter-layer (or inter-level) dielectric (ILD) layer 240 is then formed over the substrate and the gate structure, as shown in FIG. 2J. The ILD layer 240 may be formed by chemical vapor deposition (CVD), high density plasma CVD, spin-on, sputtering, or other suitable methods. In an embodiment, the ILD layer 240 includes silicon oxide. Alternatively, the ILD layer 240 could include silicon oxy-nitride, silicon nitride, or a low-k material.

Although not illustrated, one or more annealing processes are performed on the semiconductor device to activate the active regions. These annealing processes may have relatively high temperatures (such as temperatures greater than approximately 700 degrees Celsius) and may be performed before or after a CMP process on the ILD layer 240. Advantageously, the gate dielectric layer is capable of withstanding high annealing temperatures without crystallizing, thus reducing potential gate leakage current.

Thus, FIGS. 2A-2J illustrate the various stages of a "gate first" process. Additional processes may be performed to complete the fabrication of the semiconductor device 200, such as the forming of an interconnect structure and other backend structures known in the art. For the sake of simplicity, these processes are not illustrated herein.

In another process flow, gate stack could be formed on fluorine passivated surface after removing dummy gate electrode in replacement process flow.

As described above, it is understood that the gate electrode layer 210 may either be used in a "gate first" process, or the gate electrode layer 210 may also be used as a dummy gate electrode in a "gate last" process. For example, if gate electrode 210 of FIGS. 2F-2J was formed of a polysilicon material, a chemical-mechanical-polishing (CMP) process could be performed on the ILD layer 240 of FIG. 2J to expose a top surface of the gate structure 220. Following the CMP process, the top surface of the gate structure 220 is substantially co-planar with the top surface of the ILD layer 240 on either side of the gate structure 220. Although not illustrated, one or more annealing processes are performed on the semiconductor device to activate the active regions 234. These annealing processes may have relatively high temperatures (such as temperatures greater than approximately 700 degrees Celsius) and may be performed before or after the CMP process. As discussed above, the gate dielectric layer 208 is capable of withstanding such high annealing temperatures without crystallizing, thus reducing potential gate leakage current. Afterwards, the gate electrode 210 is removed, thereby forming a trench in place of the gate electrode 210. The gate electrode 210 may be removed in a wet etching or a dry etching process known in the art, while the rest of the layers of the semiconductor device remain substantially un-etched. Since the polysilicon gate electrode 210 is removed in the gate last process, it is also referred to as a "dummy gate." Finally, a metal layer is formed within the trench and over the gate dielectric layer 208.

It is understood that additional processes may be performed to complete the fabrication of the semiconductor device 200. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The fluorine-passivated surface 204 of substrate 201 offers many advantages, it being understood that different embodiments may offer different advantages, and that no particular advantage is necessarily required for all embodiments. One of the advantages offered by the fluorine-passivation process of the present disclosure is to have lower interface defect density (Dit), which allows for enhanced insulation and function of the gate oxide to increase carrier mobility, and increase device reliability. As noted above, high temperature implantation/doping and annealing processes are avoided thereby decreasing Dit, maintaining dielectric constants of the gate oxide layers, and also reducing thermal budget for the device fabrication. A further advantage of the fluorine-passivation process of the present disclosure is reduced current effective thickness (Cet) of the gate oxide layers to improve scale in IC device fabrication. As noted above, the optional interfacial layer 206 is less than 1 nm, and in the present embodiment, in a range of between about 0.3 nm and 1 nm, and the dielectric layer 208 is between about 1 nm and 3 nm. It has been further observed that fluorine-passivation of the substrate surface also allows for effective atomic layer deposition of a gate oxide layer (e.g., a high-k oxide) at the fluorine-passivated surface.

Accordingly, the present disclosure achieves a reduced gate leakage current, and simultaneously the gate oxide layers 206 and 208 are reduced in overall thickness and do not require doping that would lower the dielectric constant value. Hence, the present disclosure offers desired advantages of lower leakage current without sacrificing either the overall thickness or the dielectric constant of the gate oxide.

Referring now to FIG. 3, a system 300 for fluorine-passivating a substrate of the semiconductor device includes, in one embodiment, a carrier gas supply 302, two mass flow controllers 304a, 304b operably coupled to the carrier gas supply 302, a HF vapor generator 306 operably coupled to MFC 304a, an IPA vapor generator 308 operably coupled to MFC 304b, a mixer 310 operably coupled to HF vapor generator 306 and alcohol vapor generator 308, and a spray chamber 312 operably coupled to mixer 310. Controlled amounts of carrier gas, such as nitrogen, from carrier gas supply 302, is supplied to HF vapor generator 306 and alcohol vapor generator 308 by MFCs 304a and 304b, respectively, to supply controlled amounts of the HF vapor and the alcohol vapor into mixer 310. Mixer 310 then provides the fluorine-passivation mixture of HF vapor and alcohol vapor to the spray chamber 312, where the mixture is used to passivate the substrate surface of the semiconductor device at room temperature and atmospheric pressure. MFCs 304a, 304b may be used to tune the fluorine-passivation process to provide a desired concentration of fluorine at the passivated surface and/or to minimize concentrations of carbon and oxygen at the passivated surface.

In one example, the flowrate of HF vapor was between about 500 and about 10000 ml in carrier gas of per liter of nitrogen per minute and the flowrate of IPA vapor was between about 1000 and about 10000 ml in carrier gas of per liter of nitrogen per minute provided to mixer 310. The substrate surface was then processed by the passivation mixture for between 10 and 200 seconds at room temperature and atmospheric pressure in spray chamber 312. In another example, about 6 ml of HF vapor per liter of nitrogen per minute and about 2 ml of IPA vapor per liter of nitrogen per minute were provided to mixer 310. The substrate surface was then processed by the passivation mixture for a process time range from 10 to 200 seconds at room temperature and atmospheric pressure in spray chamber 312

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, the method comprising:
   providing a substrate;
   passivating a surface of the substrate with a mixture of hydrofluoric acid and alcohol to form a fluorine-passivated surface;
   forming a gate dielectric layer over the fluorine-passivated surface; and
   forming a metal gate electrode over the gate dielectric layer.

2. The method of claim 1, wherein the mixture includes between about 10 wt % and about 80 wt % of hydrous hydrofluoric acid vapor.

3. The method of claim 1, wherein the alcohol is one of isopropyl alcohol and methanol.

4. The method of claim 1, wherein the passivating the surface of the substrate includes processing the surface of the substrate with a mixture of hydrofluoric acid vapor and alcohol vapor at room temperature and atmospheric pressure.

5. The method of claim 1, wherein the passivating the surface of the substrate includes processing the surface of the substrate with the mixture of hydrofluoric acid and alcohol to minimize atomic concentrations of carbon and oxygen at the fluorine-passivated surface.

6. The method of claim 1, wherein the fluorine-passivated surface includes fluorine at an atomic concentration greater than 2%.

7. The method of claim 1, wherein the gate dielectric layer has a higher dielectric constant than silicon oxide and is formed by atomic layer deposition to a thickness between about 1 nanometer and about 3 nanometers.

8. The method of claim 1, further comprising:
   before the passivating the surface of the substrate, cleaning the surface of the substrate with one of hydrofluoric acid, ammonium hydroxide, hydrogen peroxide, hydrochloric acid, sulfuric acid, and ozone.

9. The method of claim 1, further comprising:
   before the forming the gate dielectric layer, forming an interfacial layer over the fluorine-passivated surface, the interfacial layer having a dielectric constant of silicon oxide and having a thickness less than about 1 nanometer.

10. A method of fabricating a semiconductor device, the method comprising:
    providing a substrate;
    cleaning a surface of the substrate to remove particulates and contaminants;
    passivating the cleaned surface of the substrate with a mixture of hydrofluoric acid vapor and isopropyl alcohol vapor to form a fluorine-passivated surface including fluorine at an atomic concentration greater than 2%;
    forming an interfacial layer over the fluorine-passivated surface to a thickness less than 1 nanometer;
    forming a gate dielectric layer over the interfacial layer to a thickness between about 1 nanometer and about 3 nanometers; and
    forming a metal gate electrode over the gate dielectric layer.

11. The method of claim 10, wherein the mixture includes between about 10 wt % and about 80 wt % of hydrofluoric acid vapor.

12. The method of claim 10, wherein the passivating the surface of the substrate includes processing the surface of the substrate with the mixture of hydrofluoric acid vapor and isopropyl alcohol vapor at room temperature and atmospheric pressure.

13. The method of claim 10, wherein the passivating the surface of the substrate includes processing the surface of the substrate with the mixture of hydrofluoric acid vapor and isopropyl alcohol vapor to minimize atomic concentrations of carbon and oxygen at the fluorine-passivated surface.

14. The method of claim 10, wherein the interfacial layer has a dielectric constant of silicon oxide and the gate dielectric layer has a dielectric constant higher than silicon oxide, and further wherein the interfacial layer and the gate dielectric layer are formed by atomic layer deposition to a thickness less than 1 nanometer and a thickness between about 1 nanometer and about 3 nanometers, respectively.

15. A semiconductor device, comprising:
    a substrate comprising a fluorine-passivated surface;
    an interfacial layer disposed over the fluorine-passivated surface, the interfacial layer having a thickness less than about 1 nanometer;
    a gate dielectric layer disposed over the interfacial layer, the gate dielectric layer having a higher dielectric constant than the interfacial layer; and
    a metal gate electrode disposed over the gate dielectric layer.

16. The semiconductor device of claim 15, wherein the fluorine-passivated surface includes fluorine at an atomic concentration greater than 2%.

17. The semiconductor device of claim 15, wherein the gate dielectric layer has a thickness between about 1 nanometer and about 3 nanometers.

18. The semiconductor device of claim 15, wherein the gate dielectric layer includes at least one of AlO, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO.

19. The semiconductor device of claim 15, wherein the metal gate electrode includes at least one of TiN, TaN, W, Al, and Cu.

20. The semiconductor device of claim 15, further comprising a shallow trench isolation structure in the substrate adjacent the metal gate electrode.

* * * * *